United States Patent

[11] 3,613,112

[72] Inventor Daniel J. Kanter
Morris Plains, N.J.
[21] Appl. No. 884,274
[22] Filed Dec. 11, 1969
[45] Patented Oct. 12, 1971
[73] Assignee Ragen Precision Industries, Inc.
North Arlington, N.J.

[54] ANALOG-TO-DIGITAL CONVERSION AND ASSOCIATED CIRCUITRY
9 Claims, 12 Drawing Figs.

[52] U.S. Cl. ........ 340/347 AD, 328/185
[51] Int. Cl. ........ H03k 13/02
[50] Field of Search ........ 340/347; 328/185

[56] References Cited
UNITED STATES PATENTS
3,493,961 2/1970 Hansen ........ 340/347
3,316,547 4/1967 Ammann ........ 340/347

*Primary Examiner*—Thomas A. Robinson
*Attorney*—Popper, Bain & Bobis

ABSTRACT: A system for converting analog input signals into their digital output counterparts, and circuit constituents of the system which are particularly suitable for realization in monolithic semiconductor integrated circuit form.

INVENTOR
DANIEL J. KANTER
BY Popper, Bain + Bobis
ATTORNEY

ANALOG-TO-DIGITAL CONVERSION AND ASSOCIATED CIRCUITRY

BACKGROUND OF THE INVENTION

This invention relates to analog to digital conversion and more particularly to precision analog to digital conversion using monolithic semiconductor integrated circuitry.

In analog to digital conversion, the signals to be converted have levels which typically represent, i.e. are analogous to, measurement quantities such as speed, temperature, etc., and each "analog" signal level is transformed into a plurality of discrete, i.e. "digital" signals. Usually, the digital signals are in accordance with the standard binary system of notation so that, for example, a voltage level of 10 becomes converted into signals which represent its binary equivalent 1010, where the l's are generally positive polarity pulses and the O's are generally the absence of any signal or negative polarity pulses.

In one commonly employed type of analog to digital conversion a weighted resistive network is used. The conversion is produced by finding the binary constituents of successively decreasing magnitudes in the applied input and summing them until the output analog magnitude associated with the output digital signals is equal to the input analog magnitude that is being converted. Unless the resistors are highly precise, the digital output will be in error. The disadvantage encountered with resistive analog to digital conversion is particularly pronounced in the case of monolithic semiconductor integrated circuitry where the tolerances on resistive elements must be appreciable.

Another type of analog to digital conversion, which is in wide use, employs a ramp signal which activates a counter starting at a reference level and terminates the counter when the ramp reaches the level of the analog input being converted. This technique avoids the need for a resistive divider network, but it is attended by considerable inaccuracies of its own. Aging of the constituents, variations in temperature and related phenomena make the ordinary ramp-controlled analog to digital converter less accurate than the converters which employ precisely calibrated resistive divider networks.

Accordingly, it is an object of the invention to enhance the precision of analog to digital conversion, particularly in the case of monolithic semiconductor integrated circuitry. A related object is to realize precise analog to digital conversion without the need for a resistive divider network, A further object is to overcome the disadvantages of conventional ramp-controlled analog to digital conversion.

Another consideration in analog to digital conversion is the problem of noise. Frequently, the analog signals to be converted travel over a transmission path of considerable length. In such cases where the path is a noisy channel it is advantageous to reduce the noise effect by locating the converter at the position of sensing. This places severe restrictions on the size, weight power consumption and environmental tolerances of the converter.

Accordingly, another object of the invention is to facilitate the realization of precise analog to digital conversion by a small device. A related object is to achieve a complete, highly precise converter which occupies only a small, lightweight, low-power, integrated circuit chip that is able to operate under extreme environmental conditions.

Still another object of the invention is to realize analog to digital conversion in a system with an improved noise characteristic over that conventionally encountered.

SUMMARY OF THE INVENTION

In accomplishing the foregoing and related objects, the invention provides calibratible ramp-controlled analog to digital conversion. The inaccuracies of conventional ramp-controlled analog to digital conversion are surmounted by calibration which is either manually or automatically controlled, depending upon the logic that is employed.

The conversion system employs a comparator assemblage with separate comparators for the lowest and highest anticipated signal levels. Calibration is initiated by presetting a relatively negative reference voltage on a low-level comparator and a relatively positive reference voltage on a high-level comparator. For that purpose, each comparator makes use of gated feedback and an associated storage element which is used to store a voltage that is related to the reference signal during the calibration interval.

The ramp signal is applied to the comparators which respectively start and stop the count of an oscillator output. During calibration, the comparators are set with reference signal levels. If the generator of the ramp signal is functioning in accordance with the desired precision, the low-level comparator will terminate the operation of the control oscillator when the count reaches a level corresponding to the preset reference signal. If the ramp reaches the preset reference level before the desired count is reached, that is an indication that the ramp discharge occurs at too rapid a rate and compensation is made by charging the ramp control capacitor until the end of the count interval. Contrawise, if the end of the count period is reached before the ramp reaches the preset reference level, that is an indication that the ramp discharge occurs too slowly and a corresponding adjustment in the charge of the ramp capacitor is made by discharging it until the preset reference level is encountered. This procedure is repeated until the charge of the ramp capacitor produces a ramp discharge which is coincident with termination of the prescribed count.

As a result the system is compensated for any inaccuracies that exist in the ramp generator, the oscillator, and other components of the system that introduce errors which are proportional to inputs. In accordance with one aspect of the invention, the calibration takes place automatically.

In order to achieve microminiaturization, high speed and low power for the analog to digital conversion system, the invention provides for use of metal-oxide-silicon devices. Most of these devices advantageously make use of complementary symmetry. Some of them, however, are of the N or P-type alone. Additional components are diffused resistors and thin film capacitors.

The use of complementary symmetry metal-oxide-silicon devices provides ease of fabrication for the entire system in a monolithic silicon structure. In addition, the metal-oxide-silicon devices provide low power requirements because of their high impedance characteristic when "off" and conversely have a suitably high speed because of their low impedance characteristic when "on." Another advantage of metal-oxide-silicon devices is that they are easier to fabricate than other integrated circuit devices because the depth of their diffusion is not critical, they are smaller than other semiconductor devices and they have no voltage offset.

In accordance with another aspect of the invention, the entire analog to digital conversion system is realized on a maximum of two substrates, one for metal-oxide-silicon circuitry and the other for various passive, nonprecision components.

BRIEF DESCRIPTION OF THE DRAWINGS

Other aspects of the invention will become apparent after considering an illustrative embodiment taken in conjunction with the drawings in which.

DETAILED DESCRIPTION OF AN ILLUSTRATIVE EMBODIMENT

Figure 1:
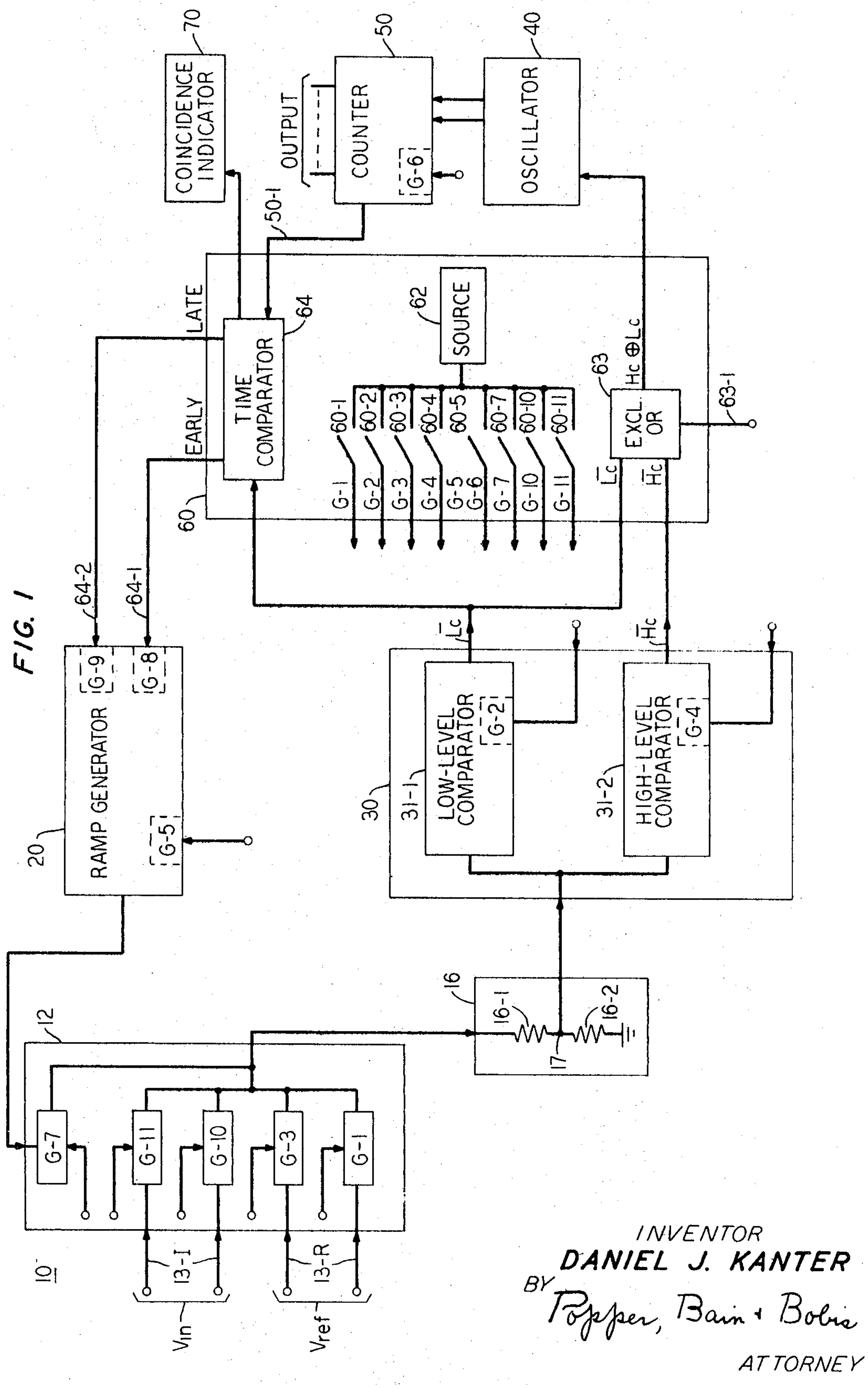
FIG. 1 is a generalized block diagram of an analog to digital conversion system in accordance with the invention.

Turning to the drawings, an analog to digital converter system 10 in accordance with the invention provides for the precision conversion of signals applied to an input multiplex unit 12. The conversion is accomplished by using a ramp generator 20 in conjunction with a comparator assemblage 30, an oscillator 40, and a counter 50, under the control of a logic network 60.

Construction And Operation Of The Overall System 10

Initially, the system 10 of FIG. 1 is calibrated with respect to a reference signal applied to the input multiplex unit 12 over a pair of reference lines 13–R. The "multiplex" designation of the unit 12 refers to its facility for the selective and sequential gating of signals into the system 10 by way of a voltage divider unit 16. The latter is provided to adjust the level of the applied signals to be suitable for the remainder of the system 10.

The reference signal on the lines 13–R has a known digital counterpart and is used in the calibration of the system 10 under the control of the logic network 60. After calibration is achieved, there is an appropriate indication on a coincidence indicator 70. The system 10 is then ready for the precision conversion of analog signals on a pair of input lines 13–I, provided by any suitable transducer, such as one which indicates speed, temperature or the like. As shown in FIG. 1, the system 10 is arranged for the conversion of positive or negative polarity analog inputs.

The desired analog to digital conversion is achieved by using the ramp generator 20 to provide a linearly changing signal, as by the discharge or charge of a capacitor, that ranges between prescribed limits and operates the oscillator 40 during the interval that the ramp has its excursion between levels set in the comparator assemblage 30 by each analog input. The number of cycles indicated by the counter 50 during the ramp interval gives the desired digital output, which because of calibration compensation for system errors, has a high degree of precision.

Details of the various units in FIG. 1 are set forth in the other figures and are described in detail below. In general terms, calibration of the system 10 begins with a reference signal $V_{ref}$ of specified magnitude on the reference lines 13–R, with a known digital signal counterpart.

The reference signal is applied directly to gates G–1 and G–3 which are operated by the closure of switches 60–1 and 60–3 in the logic network 60. The gates G–1 and G–3 may take any of various known forms. A type which is suitable for monolithic semiconductor integrated circuitry is discussed in conjunction with the detailed explanation of the ramp generator 20, below.

Considering first the closure of the switch 60–1 within the logic network 60, this applies a suitable enablement signal from a source 62 to the gate G–1 and causes the reference voltage at gate G–1, taken with respect to ground, to appear at the voltage divider unit 16. The latter is formed by two series-connected resistors 16–1 and 16–2 with a tap point 17 that extends to the comparator assemblage 30. The purpose of the divider unit 18 is to adjust the level of each applied input to the remainder of the system 10. Thus where the system constituents are microminiaturized the divider unit 16 prevents a prescribed maximum level from being exceeded.

Entry of reference voltage at the tap point 17 into one of the comparators 31–1 or 31–2 of the assemblage 30 is governed by the closure, in the logic network 60, of a gate switch 60–2 or 60–4. For illustration, it will be assumed that the level of the reference signal set in the high-level comparator 31–2 is more positive than that set in the low-level comparator 31–1. Closure of the switch 60–2 activates an internal gate G–2 in the low-level comparator 31–1 and, as described in greater detail below, presets the low-level comparator 31–1 at the reference level, with respect to ground, appearing at the input gate G–1.

Once the low-level comparator 31–1 has been set, the reference level at gate G–3 is set in the high-level comparator 31–2, with respect to ground, by closure of the third and fourth switches 60–3, 60–4 in the logic network 60.

When both the low-level comparator 31–1 and the high-level comparator 31–2 have been preset, the ramp generator 20 is started by the response of the internal gate G–5 to closure of the reset switch 60–5 in the logic network 60. A further switch 60–8 is closed to permit the output of the ramp generator 20 to be applied through a multiplex gate G–7 to the comparator assemblage 30 by way of the voltage divider unit 16. As described in detail below, the starting of the ramp generator 20 initiates a cycle of operation during which the ramp output has an interval over which its magnitude decreases linearly from a prescribed maximum to a prescribed minimum.

As the ramp output diminishes in magnitude, it first reaches the level of the reference voltage that has been preset in the high-level comparator 31–2. When there is coincidence between the ramp output and the preset reference voltage, the high-level comparator 31–2 produces a change in signal level on the output line $\overline{H}_c$. This is applied to one terminal of an EXCLUSIVE-OR unit 63 within the logic network 60. The unit 63 produces an enabling output when either, but not both, of its enabling inputs is present.

During the further excursion of the ramp output, it reaches the level level in the low-level comparator 31–1 and changes the level on the output line $\overline{L}s$ . This output is applied to a second input terminal of the EXCLUSIVE-OR unit 63.

The particular inputs of the EXCLUSIVE-OR unit 63 are in accordance with the construction of the oscillator 40. As will become apparent in the detailed discussion below, the outputs from the EXCLUSIVE-OR unit 63 cause the oscillator 40 to stop operation as long as the ramp output is above or below the preset reference voltages.

During the interval between the activation of the high-level and low-level comparators 31–2 and 31–1 the counted number of oscillator cycles gives the digital counterpart of the reference voltage. If the low-level comparator 31–1 operates at the instant that the counter 50 attains the reference voltage count, the system 10 of FIG. 1 is in calibration. An indication to that effect is provided by an output from a time comparator 64 to the coincidence indicator 70, and the system 10 may be used for the analog to digital conversion of any applied input.

In the general case, however, the system 10 will not be in calibration, and the low-level comparator 31–1 will be actuated either before or after the counter 50 attains the prescribed count. In the former case, where the low-level comparator 31–1 operates early, that indicates that the ramp has too great a slope. Where the ramp is realized by the discharge of a capacitor, the discharge is occurring at too great a rate and compensation is achieved by operating an internal gate G–9 of the ramp generator 20 over a line 64- to raise the charge on the ramp capacitor until the end of the prescribed count output. The EXCLUSIVE-OR unit 63 is inhibited during this interval at a terminal 63–1 by a signal from the time comparator line 64–1.

In the case where the low-level comparator 31–1 operates late, the internal ramp capacitor is discharged by operating a gate G–8 over a line 64–1 until the count associated with the reference voltage is attained.

It will be appreciated that the logic network 60 shown in FIG. 1 is merely illustrative of a calibratible system. The constituents of a representative logic network for a self-calibrating analog to digital conversion system are discussed below in conjunction with FIGS. 6A through 6C.

Once the system 10 is in calibration, it is used to effect the desired analog to digital conversion of an input on lines 13–I. Assuming that the more positive input level is at gate G–10, this is preset in the high-level comparator 31–2 by closure of the switches 60–10 and 60–4 (to operate gate G–4). The less positive input level at gate G–11 is preset in the low level comparator 32 by closure of the switches 60–11 and 60–2 (to operate gate G–2).

After the comparators 31–1 and 31–2 have been preset, the desired digital to analog conversion is achieved by operating the ramp generator 20 (gate G–5), the counter 50 (gate G–6) and the ramp gate G–7. The ramp output will first achieve coincidence with the preset level of the high-level comparator 31–2 and start the oscillator 40; subsequently there will be coincidence between the ramp output and the preset level in the low-level comparator 31–1, causing the oscillator 40 to stop. The residual setting on the counter 50 provides the desired digital output.

RAMP GENERATOR 20

Figure 2A:
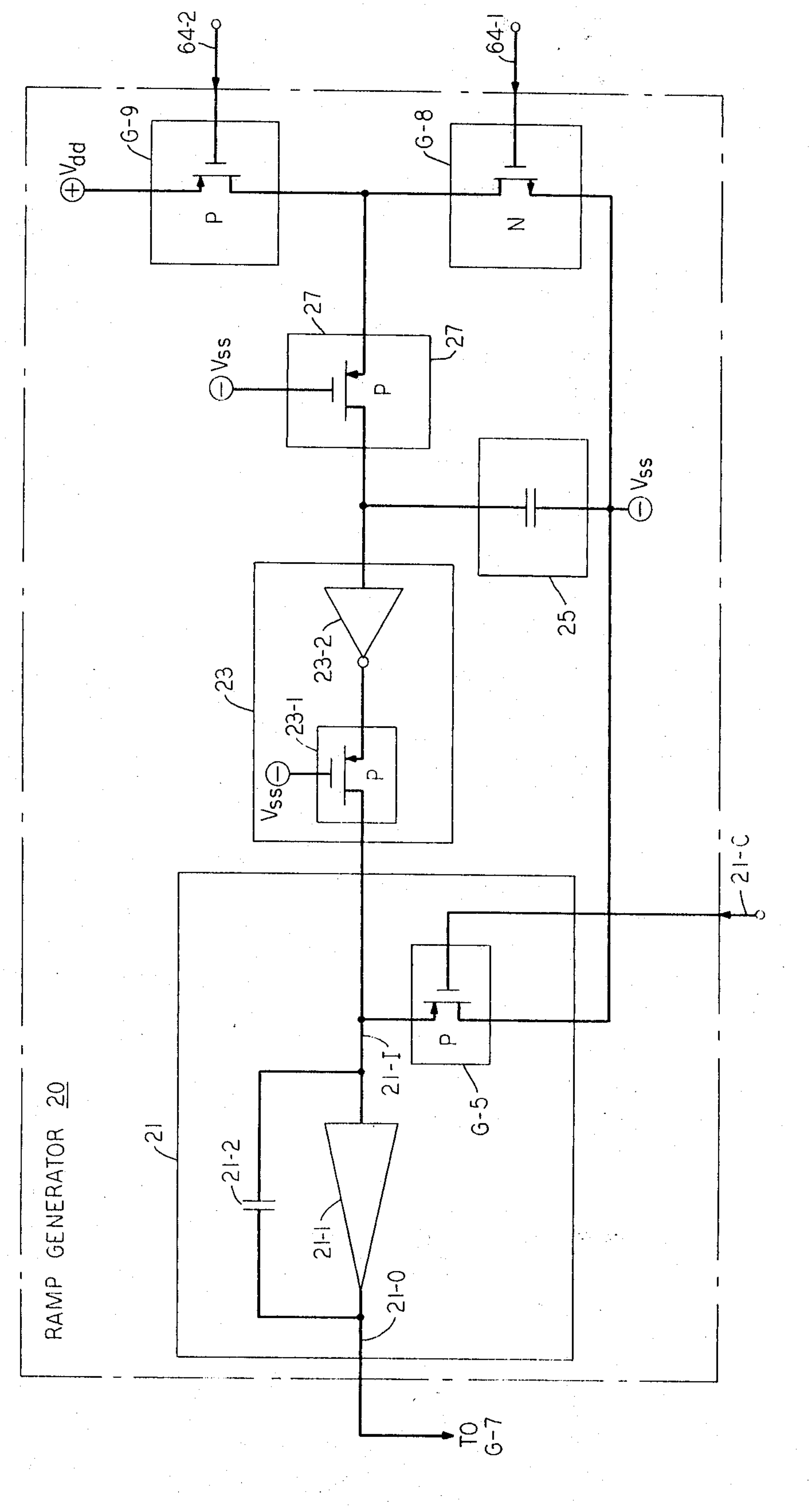
FIG. 2A is a diagram of a ramp generator, including one type of gate, for the block diagram of FIG. 1.

Details of the ramp generator 20 of FIG. 1 are set forth in FIG. 2A. The principal constituents of the ramp generator 20 are an operational amplifier 21 with an associated reset gate G–5, a voltage-variable current source 23, a ramp-slope storage element 25 in the form of a capacitor, a stabilizing resistive unit 27 and two gates G–8 and G–9 for controlling the charge and discharge of the ramp-slope capacitor 25.

The various gates G–5, G–8 and G–9, as well as the unit 27 and an internal unit 23–1 of the source 23, are shown in the form of metal-oxide-silicon devices. Such devices are desirable as integrated circuit constituents and are usable throughout the system 10.

Figure 2B:
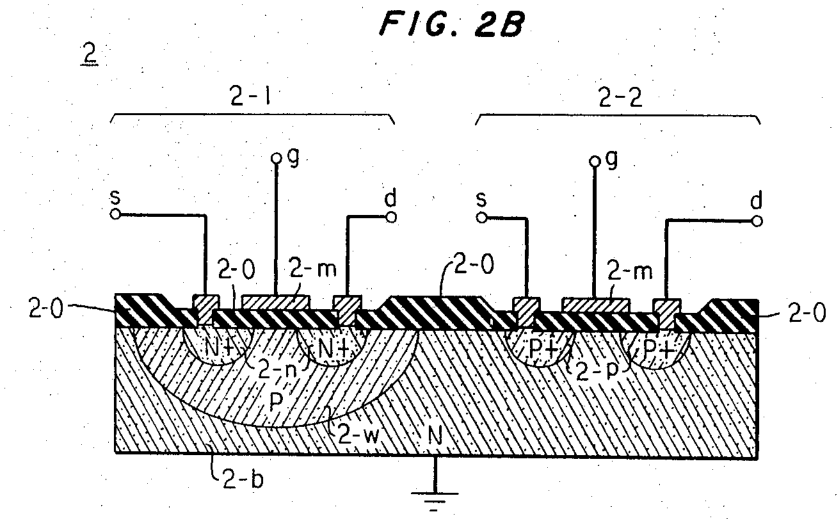
FIG. 2B is a sketch of a representative construction for metal-oxide-silicon devices used in the ramp generator of FIG. 2A and in other units of FIG. 1.

A representative cross-sectional view of a metal-oxide-silicon construct 2 is shown in FIG. 2B. The construct 2 has a base slab 2–*b* of N-type semiconductor material containing complementary devices 2–1 and 2–2. The left-hand device 2–1 has a well 2–*w* of P-type material, with two spaced apart regions 2–*n* of the N-type donor material produced by diffusion. The right-hand device 2–2 has two spaced apart regions 2–*p* of P-type donor material. Overlying the entire slab 2–*b* is a layer of oxide 2–*o* . Upon the oxide 2–*o*, and between each of the diffused regions 2–*c*, is an overlying layer of metal 2–*m*. The result is two metal-oxide-silicon (MOS) devices formed by a metal (typically aluminum), oxide (typically silicon oxide), and silicon (base material). The left-hand device 2–1 is said to be of the N-type because of the NP junctions between the regions 2–*n* and the well 2–*w*. Conversely, the right-hand device 2–2 is said to be of the P-type because of PN junctions between the regions 2–*p* and the slab 2–*b*. Terminals for the devices 2–1 and 2–2 are provided by "source" leads *s* and "-drain" leads *d* which make ohmic contact through the oxide 2–*o* with the diffused materials. A gate lead *g* is connected to each metal slab 2–*m*.

Figure 2C:
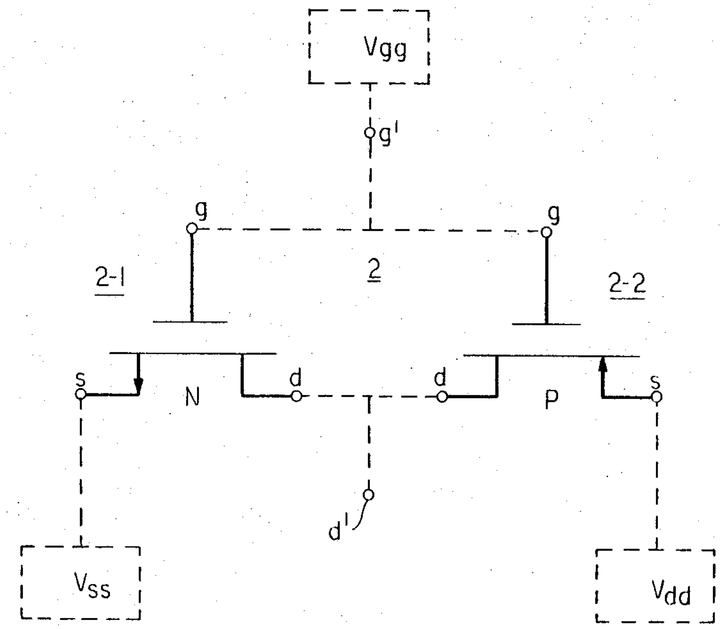
FIG. 2C is a schematic diagram of the devices in FIG. 2B.

A symbolic representation of the devices 2–1 and 2–2 of FIG. 2B is shown in FIG. 2C. The direction of the arrow on the source leads *s* of the devices 2–1 and 2–2 is in accordance with the respective NP and PN junctions at the interfaces between the N and P materials.

When the devices 2–1 and 2–2 are used independently as, for example, in the case of the gates G–5 and G–8 in FIG. 2A, a biasing voltage is connected to either a source or a drain electrode. Illustratively in FIG. 2C a negative source voltage $V_{ss}$ is connected to the source terminal *s* of device 2–1, while a positive drain voltage $V_{dd}$ is connected to the drain terminal *d* of device 2–2. A gating signal $V_{gg}$ of opposite polarity from the biasing voltage at the gate electrode *g* results in a low impedance path (because of field effects) between the outer electrodes *s* and *d*. Conversely, in the absence of a gating signal at the gate electrode *g* there is a high impedance path between the outer electrodes *s* and *d*. It is because of these impedance characteristics that metal-oxide-silicon devices are particularly suitable for small-scale, low-power, high-speed use. The low impedance that exists between the outer electrodes when the gate is operated permits high-speed operation. The high impedance that exists when the gate is not operated results in a negligible power drain.

The dashed-line connections in FIG. 2C between adjoining drain terminals *d* to the composite drain terminal *d'*, and between adjoining gate terminals *g* to the composite gate terminal *g'* apply when the two constituent devices 2–1 and 2–2 are to be used as a single complementary metal-oxide-silicon device 2. In that case the presence of a gate signal $V_{gg}$ will operate either the N device 2–1 or the P device 2–2 and produce a corresponding voltage level at an output terminal *d'*. Thus, when the gating signal $V_{gg}$ is positive a low impedance path exists between the source and drain electrodes *s* and *d* of the device 2–1 and the output is at the negative level of the source voltage $V_{ss}$.

The various MOS and CMOS devices that make up the system 10 are desirably formed on a single substrate of N-type material.

Figure 2D:
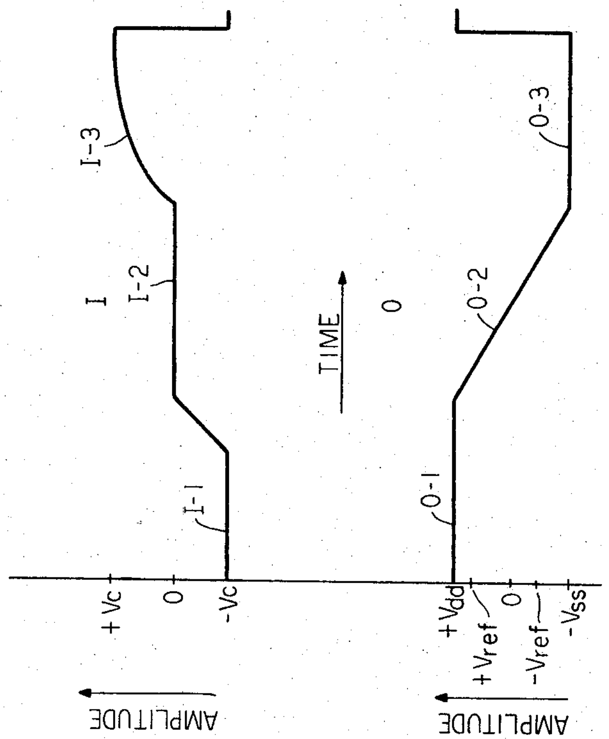
FIG. 2D is a graph of input-output characteristics versus time for the ramp generator of FIG. 2A.

Considering the construction of the operational amplifier 21, it is formed by an amplifier 21–1, illustratively of the complementary metal-oxide-silicon type, shunted by a feedback capacitor 21–2. As is well known, an amplifier 21 with direct feedback of the kind shown has an "operational" characteristic. Where the feedback is by way of a capacitor, the operation is integration. Consequently, if a substantially constant current is applied to the input 21–I of the amplifier 21, the output 21–0 will have an interval during which it is a linearly increasing or decreasing function of time. Representative input-output characteristics with time of the operational amplifier 21 are shown in FIG. 2D.

Figure 2E:
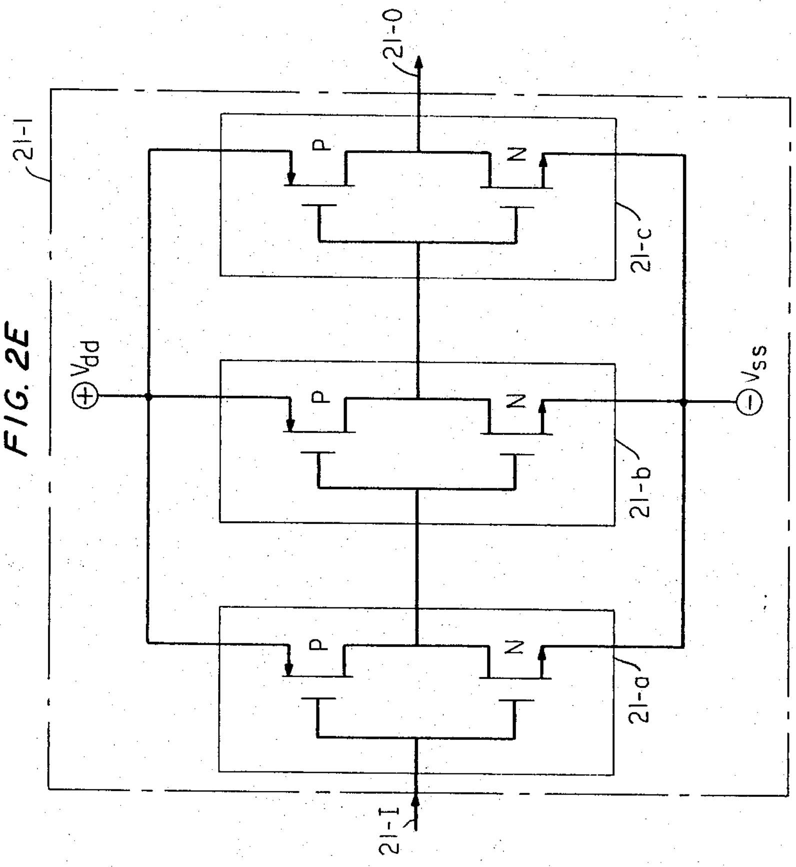
FIG. 2E is a schematic diagram of an amplifier used in the ramp generator of FIG. 2A.

The portion 21–1 of the operational amplifier 21 is advantageously formed by an odd number of inverter stages. Illustratively, as shown in FIG. 2E, there are three CMOS stages 21–*a*, 21–*b* and 21–*c*. The CMOS devices provide an extremely high input impedance, and three stages have a suitably high gain. The stages 21–*a*, 21–*b* and 21–*c* are ganged together with a positive voltage $V_{dd}$ providing the drain for one set of like electrodes, and a negative voltage $V_{ss}$ acting as the source for a complementary set of like electrodes.

The voltage variable current source 23 (FIG. 2A) is formed by a resistive element 23–1 of large magnitude and a single-stage inverter amplifier 23–2. To facilitate the fabrication of the source 23 in microminiaturized form, the resistor 23–1 is a metal-oxide-silicon device and the inverter 23–2 is a complementary pair of such devices.

The current supplied by the source 23 is applied to the input 21–I of the operational amplifier 21. In the steady state, the amplifier is at the positive saturation level shown in FIG. 2D. In order to produce a linear control ramp, the amplifier 21 is reset by the gate G–5. Operation of the gate drives the input of the amplifier to the negative value $-V_c$ of the input characteristic I in FIG. 2D. Subsequently, the input current causes the voltage level to gradually increase to zero over a first part I–1 of the characteristic I. Because of the feedback, the zero level along the second part I–2 of the characteristic I endures as long as the feedback capacitor acts as an integrator, following which the input voltage rises over the final portion I–3 of the characteristic and returns to saturation. The corresponding characteristic 0 in FIG. 2D for the signal at the output of the amplifier 21, which is applied to the comparator assemblage 30 of FIG. 1 when the ramp gate G–5 is enabled, has a positive level for a preliminary interval 0–1 and then, while the input remains at a substantially zero level, has a decreasing ramp characteristic 0–2 by virtue of the capacitive feedback. The output characteristic then reaches a negative saturation level over an interval 0– 3, and remains, until the amplifier 21 is reset.

Both the feedback capacitor 21–2 of the operational amplifier 21 and the capacitor of the storage unit 25 are desirably formed as MOS devices. If capacitance values that are necessary are too great for MOS construction, the capacitors are formed as thin films on a separate substrate than that used for the MOS and CMOS constituents.

COMPARATOR ASSEMBLAGE 30

Figure 3:
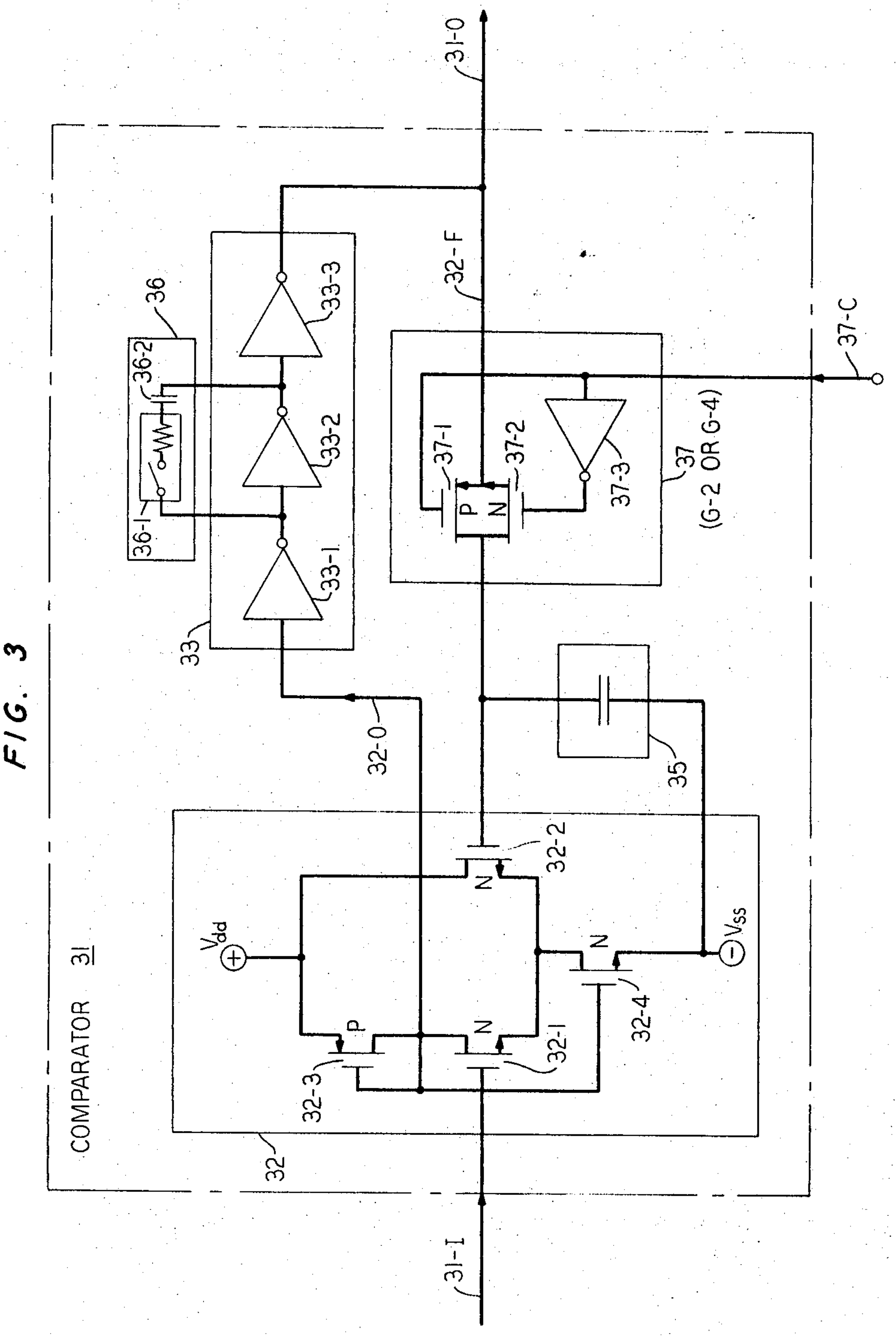
FIG. 3 is a wiring and schematic diagram of a presettable comparator, including another form of gate and constructed of metal-oxide-silicon devices, for the block diagram of FIG. 1.

A suitable MOS construction for either the low level comparator 31–1 or the high-level comparator 31–2 is given in FIG. 3 for an illustrative comparator 31.

The comparator 31 employs a differential unit 32, by which there is a change in signal level on an output lead 31–0 whenever the voltage that has been preset on the capacitor of a storage unit 35 differs from that at an input 31–I. The storage unit 35 is preset from the differential unit 32 over an output path 32–0 through an amplifier 33 by the operation, in a feedback path 32–F, of a gate 37. The latter corresponds in FIG. 1 to the gate G–2 when the comparator 31 is employed as the low level comparator 31–1 and to the gate G–4 when the comparator 31 is employed as the high level comparator 31–2.

Included in the unit 32 are differential MOS devices 32–1 and 32–2. The input device 32–1 is connected to a source of drain voltage $V_{dd}$ through an MOS device 32–3 which is disposed to act as a series resistor of high resistive magnitude. In general, the resistive elements of the system 10 desirably are MOS devices.

The sink electrodes of the devices 32–1 and 32–2 are jointly connected to an MOS device 33–4 which, with the source voltage $V_{ss}$, acts as a current source.

To achieve the desired common electrode effect for the devices 32–1 and 32–2, they are constructed with a common well of P-type material, similar to the well 2–*w* in FIG. 2B, as modified to accommodate two devices.

The amplifier 33 in the output path 32–0 is formed by three inverter stages 33–1 through 33–3. A compensating network 36, constituted by a switchable resistor 36–1 and a capacitor 36–2, is used to prevent undesired oscillations during presetting of the comparator 31 by damping its natural frequencies. The switch of the switchable resistor 36–1 is opened to increase the speed of subsequent operation. The switchable resistor may take the form of the resistive element 23–1 in FIG. 2A to which a voltage $V_{cc}$ is controllably applied.

The gate 37 is formed by complementary MOS devices 37–1 and 37–2 which are connected in back-to-back configuration to permit bilateral transmission. Thus, with a negative gating signal applied to the control terminal 37–C of the gate 37 current may flow into the storage unit 35 to charge the capacitor, or out of the storage unit to discharge the capacitor.

In the operation of the comparator 31, wherever a signal of the input terminal 31–I has a level exceeding that stored on the unit 35, there is a change in the output on the line 32–*o* which results in a positive going output from the amplifier 33 on the output terminal 31–O. If the gate 37 is operated, the capacitor 35 of the storage unit will charge until it has been preset with a counterpart of the input.

Once the comparator 31 has been preset, it is used to detect any difference between the input and preset voltages in accordance with the signal on the output terminal 31–0.

OSCILLATOR 40

Figure 4:
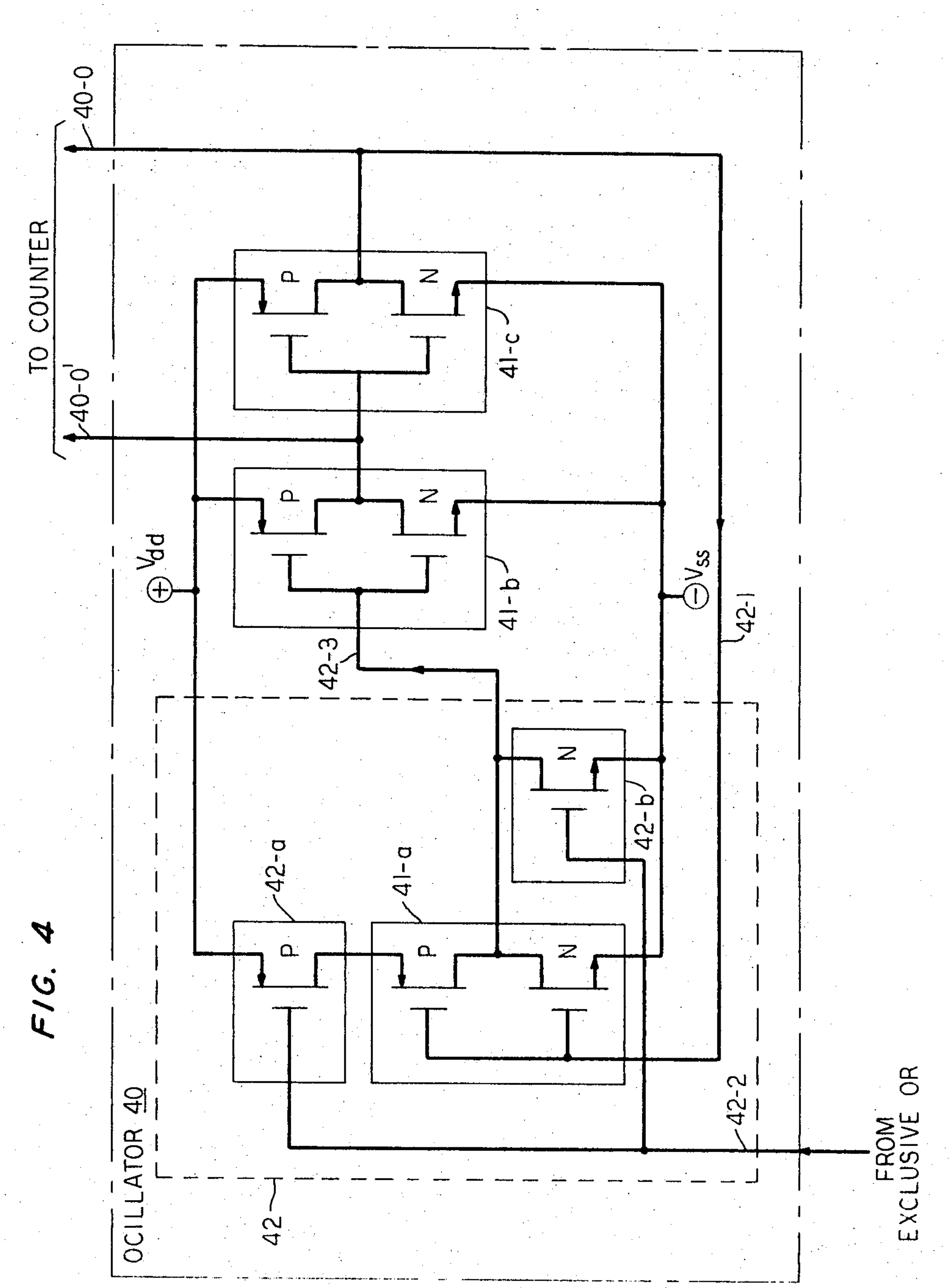
FIG. 4 is a wiring and schematic diagram of an oscillator constructed of metal-oxide-silicon devices for the block diagram of FIG. 1.

Structural details of the oscillator 40 are shown in FIG. 4 The oscillator 40 is basically a feedback amplifier with three inverter stages 41–*a* through 41–*c* which are similar to the stages 21–*a* through 21–*c* of the amplifier 21–1 in FIG. 2E. To produce oscillations a feedback line 42–1 extends from the output stage 41–*c* to the input stage 41–*a*. In addition, to control the oscillator, i.e., to make it stop or start as desired, a line 42–2 which extends jointly to MOS control devices 42–*a* and 42–*b*.

The oscillator 40 is stopped by the appearance of a relatively positive signal on the control line 42–2. This opens the device 42–*a* and closes the device 42–*b*. The result is that the drain voltage $V_{dd}$ is removed from the first stage 41–*a* and its output is short-circuited.

Outputs 40–0 and 40–0′ from the oscillator 40 extend to the counter 50 of FIG. 1. The two output leads 40–0 and 40–0′ provide the counter 50 with complementary signal states by being respectively connected to the output and input of the third stage 41–*c*. Thus, when the input to the third stage is negative and the output is positive, which is denoted in terms of binary logic as 0, 1 on the lines 40–0′ and 40–0.

It is to be noted that the first inverter stage 41–*a*, together with the control devices 42–*a* and 42–*b* form a circuit configuration 42 which can be used for NOR (NOT-OR) logic operations in the system 10, particularly to realize constituents of the control logic network 60.

In the case of NOR logic, there is a logical 1 output only when all of the logical inputs are 0's. For the gate 42 in FIG. 4 the inputs are applied to terminals 42–1 and 42–2 and the output appears at terminal 42–3. Only when 0's (negative or zero signals) appear on both input terminals 42–1 and 42–2 will there be a 1 output (positive signal).

COUNTER 50

Figure 5:
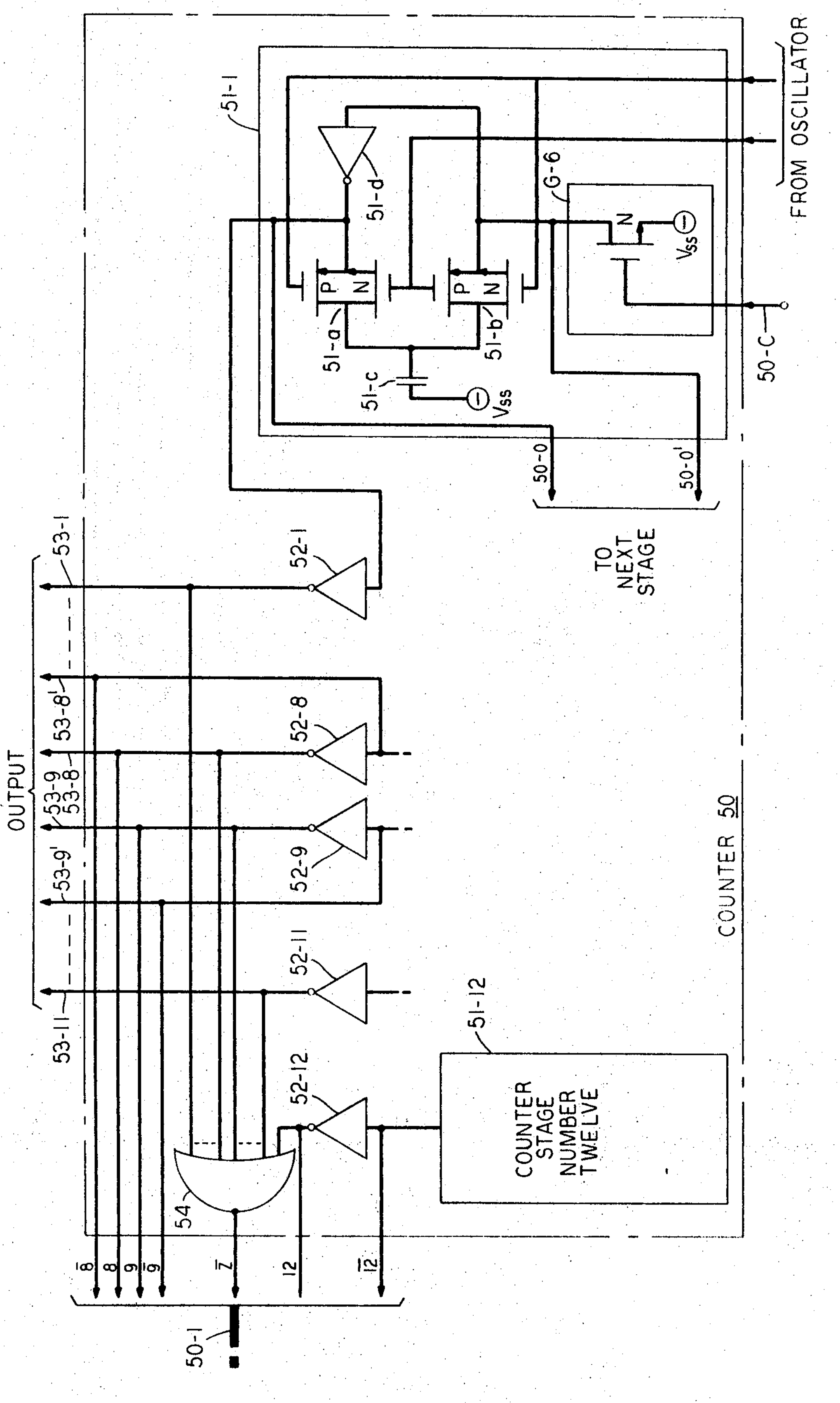
FIG. 5 is a wiring and schematic diagram of a counter constructed of metal-oxide-silicon devices for the block diagram of FIG. 1.

The counter 50 of FIG. 1 is formed by twelve cascaded stages 51–1 through 51–12 of which only the first and the last stages 51–1 and 51–12 are shown in FIG. 5. Each stage is a two-state device in which complementary signals on output leads 51–0 and 51–0′ are connected as inputs to the succeeding stage.

Each two-state device is formed by a pair of active switching elements, an inverter and a storage element. In the case of the counter stage 51–1 the active elements are the back-to-back MOS devices 51–*a* and 51–*b*, and the storage element is a capacitor 51–*c*. Included in the stage 51–1 is a gate G–6 for resetting that stage by a signal on a control line 50–C. The reset signal is applied directly to the device 51–*b* and through an inverter 51–*d* to the device 51–*a*.

In operation of the counter 50, complementary signals from the oscillator 40 are applied to the gate terminals of the composite devices 51–*a* and 51–*b*. Each change in the signal state of the oscillator 40 produces a corresponding change in signal state of the the stage 51–1. This change in signal state is communicated to the next stage by the output leads 51–0 and 51–0′. A similar effect takes place in the case of succeeding stages. Consequently, the number of cyclic changes in the signal states of the oscillator 40 become registered on the counter 50.

The direct outputs of the counter stages 51–1 through 51–11 appear on output terminals 53–1 through 53–11 by way of inverters 52–1 through 52–11. In the case of the eighth and ninth stages (not shown) complementary outputs also appear on lines 53–8′ and 53–9′, respectively. The direct and complementary outputs of the eighth and ninth stages also appear on lines 8, $\overline{8}$ and 9, $\overline{9}$ that extend, as indicated by a bundle 50–1, to the logic network 60 (FIG. 1) or 600 (FIGS. 6A through 6C).

For the twelfth stage 51–12 the direct and complementary outputs are used for control purposes only, appearing on lines 12, $\overline{12}$ in the bundle 50–1. In addition the direct output of the twelfth stage, through an inverter 52–12, appears together with the other direct outputs at a NOR gate 54 which is used to generate a signal that indicates when the counter 50 is in a zero state, i.e. has a zero count.

LOGIC NETWORK 600 AND SELF-CALIBRATING OPERATION

Figure 6A:
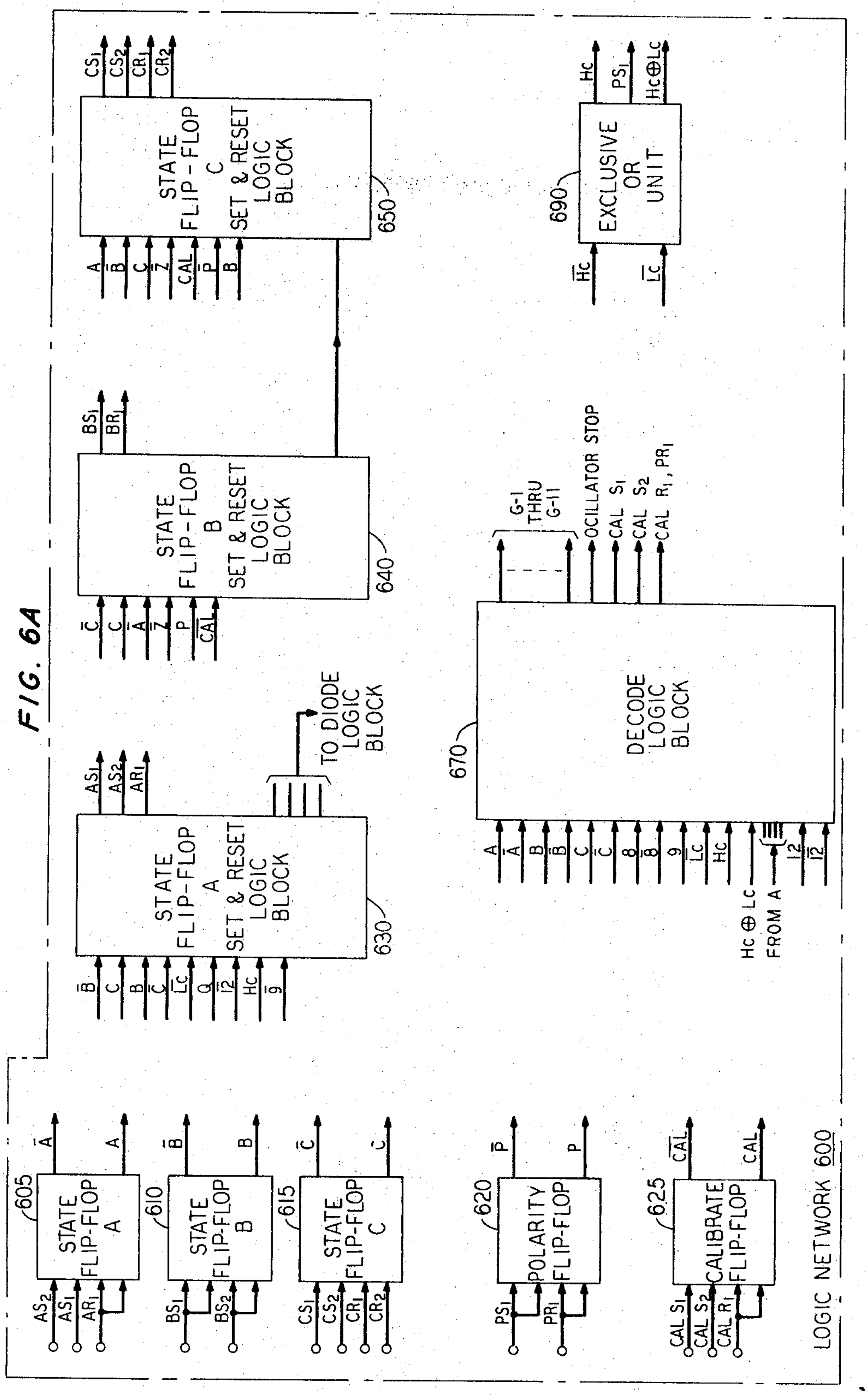
FIG. 6A is a block diagram of an alternative control logic network by which the system of FIG. 1 is rendered self-calibrating.
Figure 6B:
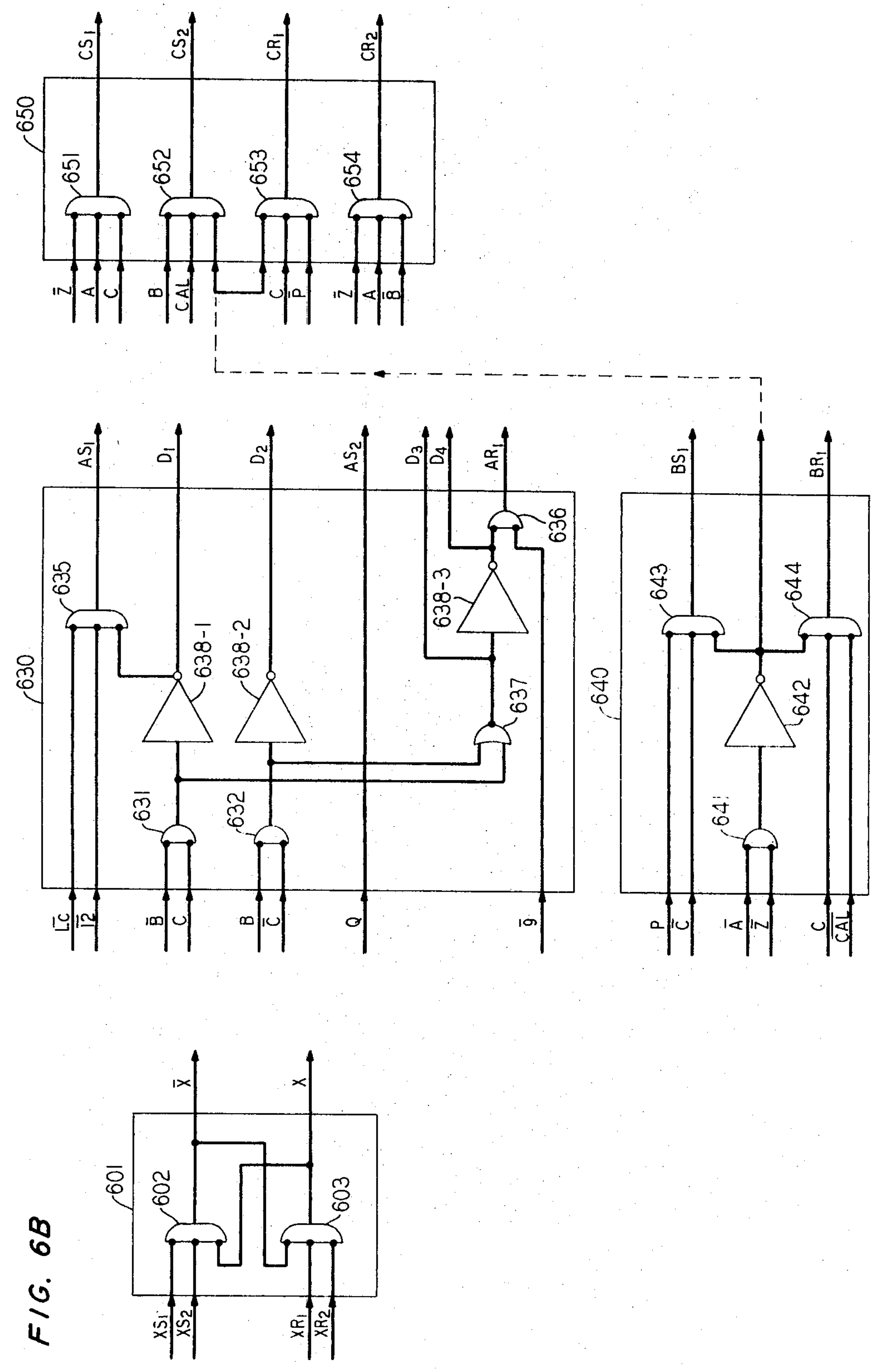
FIG. 6B is a logic diagram showing constituents of a portion of the control logic network of FIG. 6A.
Figure 6C:
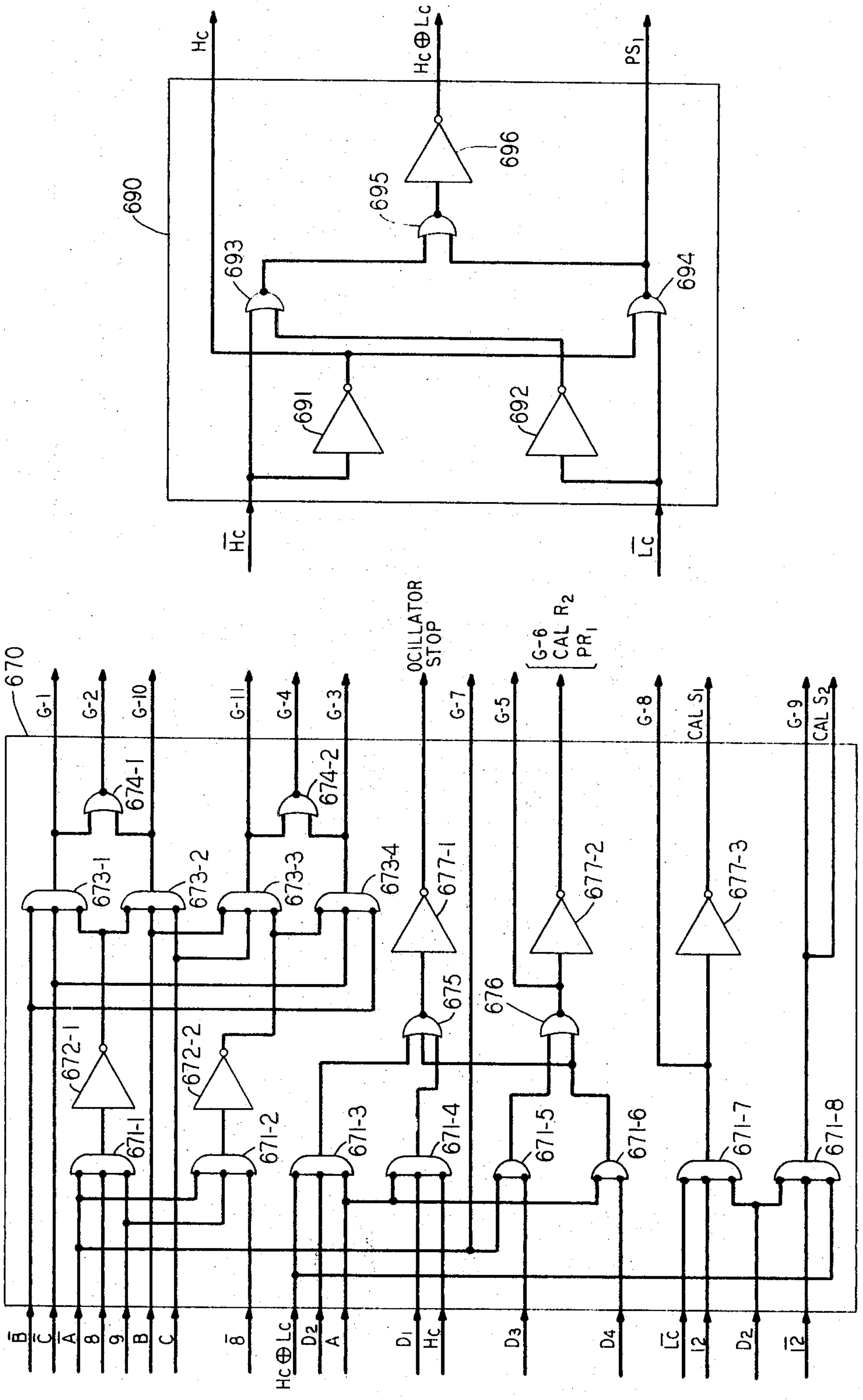
FIG. 6C is a logic diagram showing constituents of the remainder of the control logic network of FIG. 6A.

FIG. 6A shows a block diagram of a logic network 600 which is substitutible for the logic network 60 of FIG. 1 to provide a self-calibrating analog to digital conversion system.

The logic network 600 includes five control flip-flops 605, 610, 615, 620 and 625; and five associated logic blocks 630, 640, 650, 670 and 690.

Three of the flip-flops 605, 610 and 615 are used to establish successive control states of the logic network 600. It is the successive occurrence of the various states that permits continuous self-calibrating operation of the system 10.

The flip-flops 605, 610 and 615 have direct outputs on terminals A, B and C; and complementary outputs on Terminals $\overline{A}$, $\overline{B}$ and $\overline{C}$. When a direct output is a 1, the complementary output is a 0, and vice versa.

Since each flip-flop has two interchangeable states, the total number of states for the three control flip-flops 605, 610 and 615 is eight, as summarized by TABLE I for the direct outputs A, B and C.

TABLE I

| State | A | B | C |
|---|---|---|---|
| 1 | 1 | 1 | 1 |
| 2 | 0 | 1 | 1 |
| 3 | 0 | 1 | 0 |
| 4 | 1 | 1 | 0 |
| 5 | 1 | 0 | 0 |
| 6 | 0 | 0 | 0 |
| 7 | 0 | 0 | 1 |
| 8 | 1 | 0 | 1 |

The remaining two flip-flops 620 and 625 are respectively used for polarity and calibration. The polarity flip-flop 620 is set when the low-level comparator 31–1 responds to the ramp signal before the high-level comparator 31–2, indicating that the input analog signal is negative. The calibrate flip-flop 625 is used to indicate when self-calibration is completed and an analog to digital conversion of a desired quantity can be made.

The various flip-flops 605 through 625 are settable at input terminals with suffixes $S_1$ and $S_2$, and resettable by input terminals with suffixes $R_1$ and $R_2$. When a flip-flop is set it has direct and complementary outputs 1 and 0; when it is reset the outputs are interchanged to 0 and 1.

The output terminals of the flip-flops 605 through 625 are connected to the indicated inputs of logic blocks 630 through 670. Additional inputs to the logic blocks are obtained from the comparator assemblage 30 ($\overline{H}_c$ and $\overline{L}_c$), the counter 50 (8, 8, 9, $\overline{9}$, 12, $\overline{12}$ and $\overline{Z}$). The decode logic block 670 also is supplied with an EXCLUSIVE-OR input ($Hc \oplus Lc$) provided from the EXCLUSIVE-OR unit 690.

The input terminals of the flip-flops 605, 610 and 615 are connected to the indicated outputs of the logic blocks 630, 640 and 650; while the inputs of the flip-flops 620 and 625 are from the decode logic block 670 and the EXCLUSIVE-OR unit 690. The remaining outputs of the decode logic blocks operate the various gates G–1 through G–11 and the oscillator 40 of the system 10.

Each of the flip-flops 605 through 625 can be constructed, as shown in FIG. 6B for an illustrative flip-flop 601, from two gates 602 and 603. Each of the gates is of the NOR variety for which the output is a logical O unless all inputs are O's. The symbol used for both NOR gates 602 and 603, however, to facilitate the interpretation of the other logic blocks, is that of an AND gate with inverted inputs. Each of the gates 602 and 603 has three input terminals, one of which is cross-coupled to the output terminal of the other gate. The remaining terminals of the gate 602 are for setting the flip-flop and are respectively designated $XS_1$ and $XS_2$. When the flip-flop 601 is set, a 1 appears on its X output terminal. Conversely, the remaining terminals of the gate 603 are for resetting the flip-flop and are respectively designated $XR_1$ and $XR_2$. When the flip-flop 601 is reset a 1 appears on its $\overline{X}$ output terminal. The NOR gate constituents of the flip-flop 602 may each be the NOR gate 42 of FIG. 4.

Each of the logic blocks 630 through 690 shown in FIGS. 6B and 6C as formed by various combinations of inverters and NOR gates. Some of the NOR gates are depicted in the same fashion as the NOR gate 54 of FIG. 5; most, however, to simplify the resulting logic equations are shown in accordance with the symbology used in the flip-flop 601.

The logic block 630 which is used for setting and resetting state flip-flop A (605) is formed (FIG. 6B) by input NOR gates 631 and 632; output NOR gates 635 and 636; an intermediate NOR gate 637 and inverters 638–1 through 638–3.

To set and reset state flip-flop B (610) the logic block 640 of FIG. 6B has an input NOR gate 641; output NOR gates 643 and 644; and an inverter 642.

For the setting and resetting of the state flip-flop C (615), the logic block 650 of FIG. 6B has NOR gates 651 through 654.

Circuit details for the decode logic block 670 and for the EXCLUSIVE-OR unit 690 are set forth in FIG. 6C.

In the decode logic block 670 a set of input NOR gates 671–1 through 671–8 is used in conjunction with a second set of NOR gates 673–1 through 673–4, 674–1 and 674–2, 675 and 676, and various inverters 672–1 and 2 and 677–1 through 3 to produce the indicated outputs. The EXCLUSIVE-OR unit 690 employs inverters 691 and 692, NOR gates 693 through 695, and an output inverter 696.

The various logic blocks 630 through 690 function in accordance with the logical operation that is desired.

The logic equations which apply to the setting and resetting of the various states of flip-flops 605 through 615 are set forth in TABLE II.

TABLE II $AS_1 = L_c \cdot 12 \cdot B \cdot \overline{C}$ $AS_2 = Q$ $AR_1 = 9(B \cdot C + \overline{B} \cdot \overline{C})$ $BS_1 = \overline{P} \cdot Z \cdot A \cdot C \cdot$ $BR_1 = CAL \cdot Z \cdot A \cdot \overline{C}$ $CS_1 = Z \cdot \overline{A} \cdot \overline{B}$ $CS_2 = \overline{C}\overline{AL} \cdot Z \cdot A \cdot B$ $CR = P \cdot Z \cdot A \cdot \overline{B}$ $CR_2 = Z \cdot \overline{A} \cdot B$ Illustratively, the first logic equation of TABLE II, which sets forth the logical conditions that apply to the generation of a setting signal on the first setting terminal $AS_1$ of state flip-flop A (605), provides that a setting signal will be generated when there is a 1 on the line $L_c$, the counter 40 has reached a count of 212, the state flip-flop B (610) has a 1 on its B lead, and the state flip-flop C (615) has a 1 on its $\overline{C}$ lead.

Similarily, the logic equations for the decode logic block 670 are set forth by the logic equations of TABLE III.

TABLE III $G\text{–}1 = A \cdot B \cdot \overline{8} \cdot \overline{9}$ $G\text{–}2 = A \cdot B \cdot \overline{8} \cdot \overline{9} + A \cdot \overline{B} \cdot \overline{8} . \overline{9}$ $G\text{–}3 = A \cdot B \cdot 8 \cdot \overline{9}$ $G\text{–}4 = A \cdot B \cdot 8 \cdot \overline{9} + A \cdot \overline{B} \cdot 8 \cdot \overline{9}$ $G\text{–}5 = \overline{A}$ $G\text{–}6 = A(B \cdot \overline{C} + \overline{B} \cdot C) + \overline{A}(B \cdot C + \overline{B} \cdot \overline{C})$ $G\text{–}7 = \overline{A}$ $G\text{–}8 = L_c \cdot \overline{12} \cdot \overline{B} \cdot C$ $G\text{–}9 = 12 \cdot \overline{B} \cdot C(\overline{H}_c + \overline{L}_c)$ $G\text{–}10 = A \cdot \overline{B} \cdot \overline{8} \cdot \overline{9}$ $G\text{–}11 = A \cdot \overline{B} \cdot 8 \cdot 9$ $\text{Osc. Stop} = \overline{A} \cdot C(\overline{\overline{H}_c \oplus \overline{L}_c}) + \overline{A} \cdot \overline{C} \cdot H_c,\ \overline{H}_c + \overline{L}_c$ The operation of a self-calibrating and automatic measurement system 10 employing the logic network 600 is explained in conjunction with the states of TABLE I and the logic equations of TABLES II and III.

During the first state, for which the outputs on the leads A, B and C are all 1's, the low-level comparator 31–1 and the high-level comparator 31–2 of FIG. 1 are set. During the second state the counter 40 is reset. In the third state the ramp generator 20 is calibrated. The fourth state serves to reset the various constituents of the system 10. In the fifth state the low and high-level comparators 31–1 and 2 are set in order to prepare for the digital conversion of an analog measurement. The sixth state provides resetting, and the seventh state serves to give a digital measurement of an applied analog input. The eighth and final state resets the various constituents of the system 10 and acts to either return the system to the first state for recalibration or the fifth state for remeasurement.

Considering the detailed procedures, the initial effect in the first state is the operation of the oscillator 40 by virtue of the absence of a stop signal. The gate G–1 is operated simultaneously with the gate G–2 to allow the associated reference signal to be preset in the low-level comparator 31–1. When the counter 50 attains a value of 128 (lead 8 has a 1), gates G–1 and G–2 are deactivated and gates G–3 and G–4 are activated to preset the high level comparator 31–2 with the associated reference signal. The counter 50 proceeds to a count 256 (lead 9 has a 1) to disable the gates G–3 and G–4 and reset state flip-flop A (605).

The logic network 600 is then in its second state indicated by TABLE I. Initially in the second state there is simultaneous resetting of the ramp generator 20 and operation of the ramp gate G–7. This is followed by the resetting of the counter 40. The result is an enablement on the line $\bar{Z}$ which advances the logic to the next state by the resetting of state flip-flop C (615).

In the third state of the control logic, the first effect is activation of the ramp gate G–7 and the resetting of the ramp generator 20. The latter causes the ramp voltage to start down as shown in FIG. 2D. When the ramp voltage reaches the level of the positive reference signal, the high level comparator 31–2 switches and starts the oscillator 40 and the operation of the counter 50. If the ramp voltage reaches the reference level in the low-level comparator 31–2 before the counter has run its range, this indicates that the ramp has too great a slope and the gate G–9 is enabled to charge the ramp-slope capacitor 25 (FIG. 2A) until the termination of the count, at which point state flip-flop A is set and state four is attained.

However, if the counter reaches the end of its range before the reference level in the low-level comparator 31–2, this indicates that the slope of the ramp is insufficiently great and the gate G–8 enabled to discharge the ramp-slope capacitor until the reference level is reached. At that point the operation also proceeds to state four by the setting of state flip-flop A (605).

In either of the two foregoing instances, the calibrate flip-flop 625 is set so that at the end of state four an operator will know whether to proceed to state five or to return to state one.

If the low-level comparator trips at the end of the count, the operation proceeds to state four.

In the fourth state the counter 50 is reset, the ramp generator 20 is reset, the polarity flip-flop 620 is reset and the operation progresses to the next state, depending upon whether or not the calibrate flip-flop 625 has been set during state three. Where the calibrate flip-flop has been set, the first four states are repeated until the calibrate flip-flop does not become set, indicating that the system is fully calibrated.

In the fifth state, state flip-flop A has a 1 on its A terminal while the state flip-flops B and C have 0's on their B and C terminals. This operates the gate G–10 of the input multiplex unit 12 to allow an input level to be preset in the low-level comparator 31–1, followed by enablement of the gate G–11 to preset the high-level comparator 31–2. When the counter reaches the count of 256, the operation goes to state six with all state flip-flops A, B and C have zero direct outputs. This condition brings about enablement of the ramp gate G–5, resetting of the counter 40, the polarity flip-flop 620, the ramp generator 20 and stoppage of the oscillator 40. When the counter has been reset the operation proceeds to the next state which constitutes a measurement i.e. conversion of the preset input into the desired digital output. For that purpose the gate G–5 is enabled, the oscillator is started when the ramp trips one of the comparators, and stopped when it trips the other comparator. The counter output is held until the operator generates a Q signal by closing a switch (not shown) to apply a positive signal to set state flip-flop A. This results in the eighth state. Following resetting of the polarity flip-flop, the ramp generator and the counter, a return is made to state one for recalibration or to state five for a remeasurement.

While various aspects of the invention have been set forth by the drawings and the specification, it is to be understood that the foregoing detailed description is for illustration only and that various changes in circuitry, as well as the substitution of equivalent constituents for those shown and described, may be made without departing from the spirit and scope of the invention as set forth in the appended claims.

1. Apparatus for converting analog input signals into digital output signals, comprising
- means for generating a ramp signal and adjusting the slope thereof;
- means for providing a first control signal when said ramp signal reaches a first prescribed level and a second control signal when said ramp signal reaches a second prescribed level, at least one of the levels being determined by an analog input signal;
- means responsive to the two control signals for producing digital output signals in accordance with the time interval between the occurrence of the first and second control signals;
- and means for testing the slope of said ramp signal and controlling the adjustment thereof,
- the generating means comprising
  - an operational amplifier with capacitive feedback for generating said ramp signal,
  - a current source for feeding said operational amplifier,
  - and gating means for controllably resetting said operational amplifier to initiate the generation of said ramp signal thereby,
- the said current source comprising
  - an inverter amplifier constituted of a complementary metal-oxide-silicon device,
  - a ramp-slope capacitor connected to the input of said invented amplifier,
  - and a metal-oxide-silicon resistor connected at the output of said inverter amplifier.

2. Apparatus for converting analog input signals into digital output signals, comprising
- means for generating a ramp signal and adjusting the slope thereof;
- means for providing a first control signal when said ramp signal reaches a first prescribed level and a second control signal when said ramp signal reaches a second prescribed level, at least one of the levels being determined by an analog input signal;
- means responsive to the two control signals for producing digital output signals in accordance with the time interval between the occurrence of the first and second control signals;
- and means for testing the slope of said ramp signal and controlling the adjustment thereof,
- the generating means comprising
- an operational amplifier with capacitive feedback for generating said ramp signal,
- a current source for feeding said operational amplifier,
- and gating means for controllably resetting said operational amplifier to initiate the generation of said ramp signal thereby,
- further including gating means for controlling the charge and discharge of said ramp-slope capacitor to adjust the slope of said ramp signal,
- said gating means comprising a first metal-oxide-silicon gate for controlling the charge of said ramp-slope capacitor and a second metal-oxide-silicon gate for controlling the discharge of said ramp-slope capacitor.

3. Apparatus for converting analog input signals into digital output signals, comprising means for generating a ramp signal and adjusting the slope thereof;

means for providing a first control signal when said ramp signal reaches a first prescribed level and a second control signal when said ramp signal reaches a second prescribed level, at least one of the levels being determined by an analog input signal;

means responsive to the two control signals for producing digital output signals in accordance with the time interval between the occurrence of the first and second control signals;

and means for testing the slope of said ramp signal and controlling the adjustment thereof, the providing means comprising means for comparing said ramp signal with said first presecribed level and said second prescribed level and to generate, at respective coincidences thereof, said first control signal and said second control signal, said first prescribed level is being preset in a first comparator by a signal related to said analog input signal and said second prescribed level is being preset in a second comparator by a signal related to said input signal, each comparator comprising means for indicating, at an output, the existence of a difference between signals at distinctive inputs thereof, storage means connected to one of the inputs of the difference indicating means, and means for gating said output to said storage means to preset said comparator with a signal related to a signal applied at the other input thereof.

the difference indicating means comprising first and second differentially connected metal-oxide-silicon devices, a third metal-oxide-silicon device disposed in series with the first and adapted to act as a resistor of high resistive magnitude, and a fourth metal-oxide-silicon device connected jointly to the first and second devices and adapted to act, in conjunction with a voltage source, as a current source.

4. Apparatus as defined in claim 3 wherein said first and second metal-oxide-silicon devices are disposed to achieve a common electrode by a separate, diffused region constituting a well in a base of semiconductor material.

5. Apparatus for converting analog input signals into digital output signals, comprising means for generating a ramp signal and adjusting the slope thereof;

means for providing a first control signal when said ramp signal reaches a first prescribed level and a second control signal when said ramp signal reaches a second prescribed level, at least one of the levels being determined by an analog input signal;

means responsive to the two control signals for producing digital output signals in accordance with the time interval between the occurrence of the first and second control signals;

and means for testing the slope of said ramp signal and controlling the adjustment thereof, the providing means comprising means for comparing said ramp signal with said first prescribed level and said second prescribed level and to generate, at respective coincidences thereof, said first control signal and said second control signal, said first prescribed level is being preset in a first comparator by a signal related to said analog input signal and said second prescribed level being preset in a second comparator by a signal related to said input signal each comparator comprising means for indicating, at an output, the existence of a difference between signals at distinctive inputs thereof, storage means connected to one of the inputs of the difference indicating means, and means for gating said output to said storage means to preset said comparator with a signal related to a signal applied at the other input thereof an amplifier being connected between the output of said difference indicating means and gating means a compensating network for preventing undesired oscillations by damping natural frequencies of said comparator said compensating network including a switchable resistance unit comprising a controllable metal-oxide-silicon device which is operative during the storage of signals on said storage means and inoperative thereafter in order to enhance the speed of operation of said comparator.

6. Apparatus for converting analog input signals into digital output signals, comprising means for generating a ramp signal and adjusting the slope thereof;

means for providing a first control signal when said ramp signal reaches a first prescribed level and a second control signal when said ramp signal reaches a second prescribed level, at least one of the levels being determined by an analog input signal;

means responsive to the two control signals for producing digital output signals in accordance with the time interval between the occurrence of the first and second control signals;

and means for testing the slope of said ramp signal and controlling the adjustment thereof, the producing means comprising an oscillator which is started and stopped by said control signals, and means for counting the output of said oscillator, said oscillator comprising a feedback amplifier formed by a plurality of complementary metal-oxide-silicon devices, a plurality of metal-oxide-silicon control devices, one connected in series with one of said complementary metal-oxide-silicon devices and another connected in shunt therewith, and a control line for stopping said oscillator by applying a signal to open the first control device and close the second.

7. Apparatus for converting analog input signals into digital output signals, comprising means for generating a ramp signal and adjusting the slope thereof, means for providing a first control signal when said ramp signal reaches a first prescribed level and a second control signal when said ramp signal reaches a second prescribed level, at least one of the levels being determined by an analog input signal;

means responsive to the two control signals for producing digital output signals in accordance with the time interval between the occurrence of the first and second control signals;

and means for testing the slope of said ramp signal and controlling the adjustment thereof, the producing means comprising an oscillator which is started and stopped by said control signals, and means for counting the output of said oscillator;

the counting means being comprised of a plurality of stages, each comprising a first switching device having signal and control terminals, a second switching device having signal and control terminals, an inverter interconnecting like signal terminals of the two switching devices, storage means jointly connecting other like signal terminals of said devices, and means connected to the control terminals of said switching devices for causing an interchange of said signal states.

8. Apparatus as defined in claim 7 wherein each of said switching devices is a pair of back-to-back metal-oxide-silicon devices and said storage means is a capacitor.

9. Apparatus as defined in claim 8 further including a metal-oxide-silicon device for resetting said switching devices.